United States Patent
Huang

(10) Patent No.: US 7,741,872 B2
(45) Date of Patent: Jun. 22, 2010

(54) LEVEL SHIFTER

(75) Inventor: Chao-Sheng Huang, Hsin-Tien (TW)

(73) Assignee: Via Technologies, Inc., Hsin-Tien (TW)

( * ) Notice: Subject to any disclaimer, the term of this patent is extended or adjusted under 35 U.S.C. 154(b) by 30 days.

(21) Appl. No.: 12/031,051

(22) Filed: Feb. 14, 2008

(65) Prior Publication Data

US 2008/0204077 A1 Aug. 28, 2008

(30) Foreign Application Priority Data

Feb. 26, 2007 (TW) .............................. 96106431 A

(51) Int. Cl.
*H03K 19/094* (2006.01)
*H03K 19/0175* (2006.01)
*H03B 1/00* (2006.01)

(52) U.S. Cl. .............................. 326/83; 326/68; 327/108

(58) Field of Classification Search .................... 326/62, 326/68, 83

See application file for complete search history.

(56) References Cited

U.S. PATENT DOCUMENTS

| 5,786,711 | A | * | 7/1998 | Choi | ........................... 326/83 |
| 2002/0009013 | A1 | * | 1/2002 | Lee | ....................... 365/230.06 |
| 2005/0270066 | A1 | * | 12/2005 | Kozawa | ....................... 326/81 |

* cited by examiner

*Primary Examiner*—Rexford N Barnie
*Assistant Examiner*—Dylan White
(74) *Attorney, Agent, or Firm*—Kirton & McConkie; Evan R. Witt

(57) ABSTRACT

A level shifter for shifting an input signal to an output signal. The level shifter includes an input buffer biased a first voltage and a ground voltage; an output buffer and a level-processing unit both biased between a second voltage and the ground voltage; and a voltage-drop unit coupled to the level-processing unit and biased between the first voltage and the second voltage. While the first voltage is in an OFF state and the second voltage is switched on, the voltage-drop unit provides an initializing voltage for the level-processing unit according to the second voltage to shift the input signal to provide the output signal.

9 Claims, 4 Drawing Sheets

LEVEL SHIFTER

FIELD OF THE INVENTION

The present invention relates to a level shifter, and more particularly to a level shifter with an initializing function. The present invention also relates to an associated method for initializing the level shifter.

BACKGROUND OF THE INVENTION

A level shifter generally functions for shifting a voltage level in circuitry. FIG. 1 illustrates a conventional level shifter 10, which includes an input buffer 102, an output buffer 106, and a level-processing unit 104. The input buffer 102 is biased between a first voltage source VDD and ground voltage GND. The level-processing unit 104 is coupled between the input buffer 102 and output buffer 106, and biased between a second voltage source VPP and ground voltage GND, wherein VPP is higher than VDD. The output buffer 106 coupled to the level-processing unit 104 is also biased between VDD and GND. Through the level shifter, an input signal Vin with a voltage level ranged between VDD and GND can be shifted to an output signal Vout having a voltage level ranged between VPP and GND, thereby achieving the object of level shifting.

In the above-mentioned circuitry, since the first voltage source VDD and the second voltage source VPP are independent from each other, the synchronous supply of the two voltage sources cannot be guaranteed. In a case that the second voltage source VPP is switched on while the first voltage source VDD still stays off, the input buffer 102 requiring VDD is unable to work normally. Thus the voltage at its output end is unknown and the output voltage of the output signal Vout will be consequently abnormal. As a result, the operation of the entire system would be adversely affected.

SUMMARY OF THE INVENTION

Therefore, the present invention provides a level shifter with synchronous supply of independent voltage sources to avoid the above-mentioned problem.

The present invention provides a level shifter for shifting an input signal to provide an output signal. The level shifter includes an input buffer biased between a first voltage and a ground voltage and receiving the input signal; an output buffer biases between a second voltage and the ground voltage and outputting the output signal; a level-processing unit coupled to the input buffer and the output buffer and biased between the second voltage and the ground voltage for shifting the input signal to provide the output signal; and a voltage-drop unit coupled to the level-processing unit, biased between the first voltage and the second voltage, and providing an initializing voltage for the level-processing unit according to the second voltage.

The present invention also provides a method for providing an initializing voltage for shifting an input signal to provide an output signal. The method includes: providing a first voltage and a second voltage; proving a voltage drop to the second voltage to provide an initializing voltage; and generating the output signal according to the input signal, the second voltage and the initializing voltage while the first voltage is not available.

The present invention further provides a level-shifting method for shifting an input signal to provide an output signal according to a first voltage source and a second voltage source. The method includes: generating the output signal according to the first voltage and the second voltage while both the first voltage and the second voltage are available; and generating the output signal according to an initializing voltage and the second voltage while the second voltage is available and the first voltage is unavailable.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
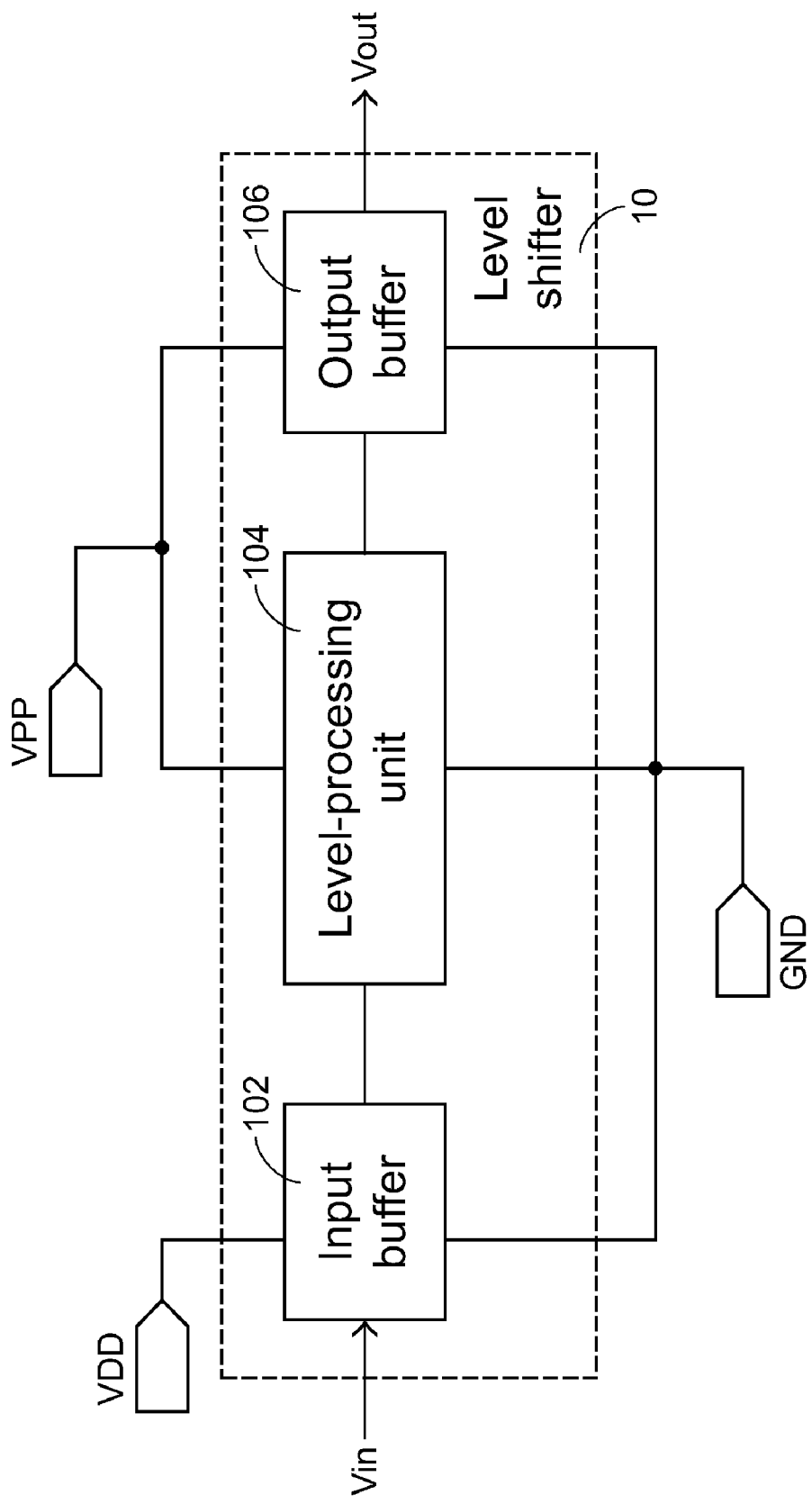
FIG. 1 is a functional block diagram illustrating a conventional level shifter.
Figure 2:
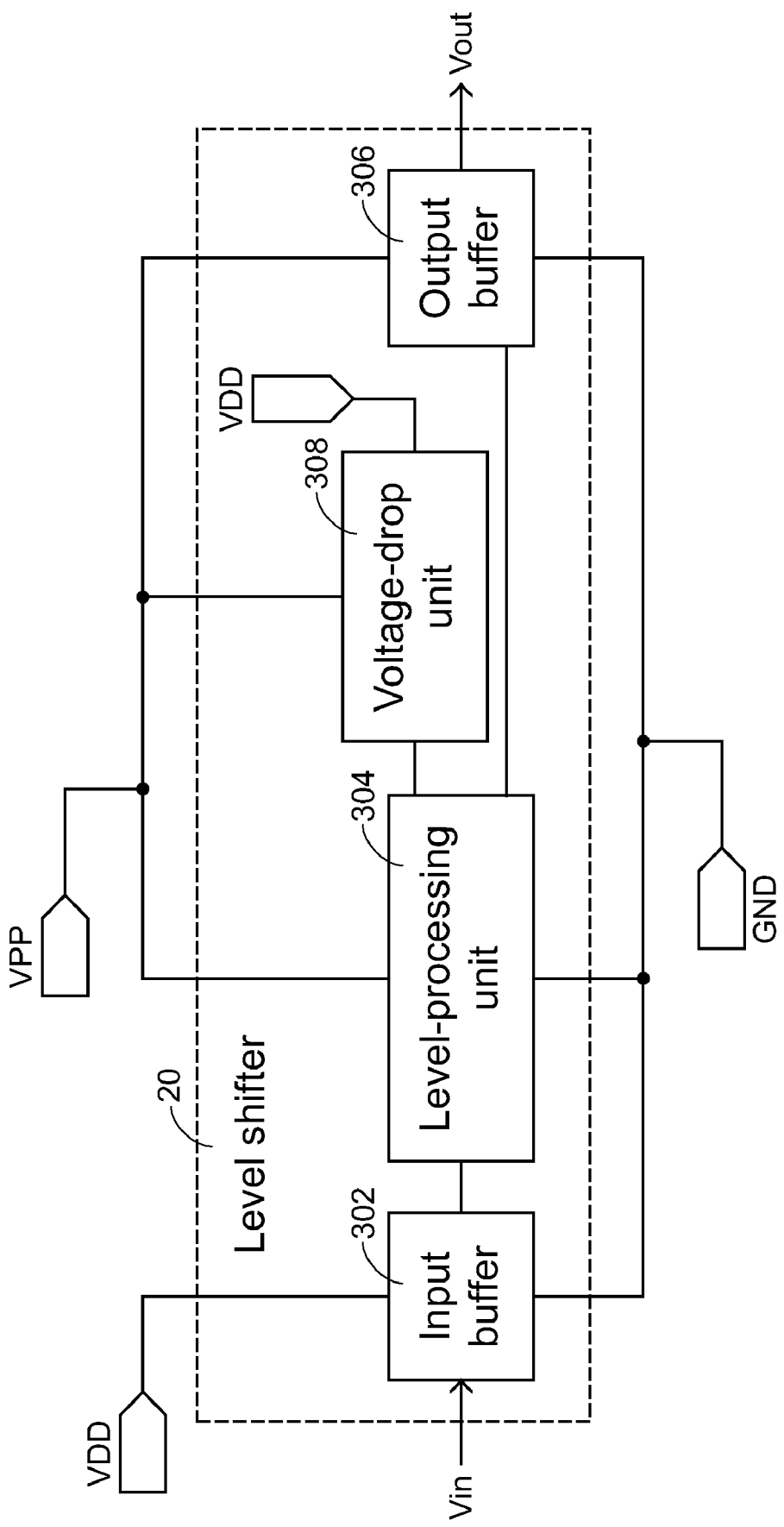
FIG. 2 is a functional block diagram illustrating a level shifter according to an embodiment of the present invention.

For avoiding abnormal operation of the level shifter resulting from asynchronous supply of different voltage sources, e.g. VDD and VPP wherein VPP is higher than VDD, a new level shifter according to an embodiment of the present invention is provided as shown in FIG. 2. The new level shifter 20 includes an input buffer 302, a level-processing unit 304, an output buffer 306 and a voltage-drop unit 308. The input buffer 302 is biased between the first voltage source VDD and ground voltage GND. The output buffer 306 is biased between the second voltage source VPP and ground voltage GND. The level-processing unit 304 is coupled between the input buffer 302 and output buffer 306, and further coupled to the voltage-drop unit 308. The level-processing unit 304 is biased between the second voltage source VPP and ground voltage GND, and the voltage-drop unit 308 is biased between the second voltage source VPP and the first voltage source VDD. With the switching on of both the voltage sources VDD and VPP, the input buffer 302 receives an input signal Vin with a voltage level ranged between VDD and GND. Subsequently, the range from VDD to GND levels of the input signal Vin is shifted to the range from VPP to GND levels. Then the output buffer 306 outputs an output signal Vout ranging from VPP to GND levels. On the other hand, if the first power source VDD is not switched on at the same time as the second voltage source VPP, the voltage-drop unit 308 will provide an initializing voltage to the level-processing unit 304 based on the second voltage source VPP. In this way, the level-processing unit 304 can work with the initializing voltage even though no expected voltage signal is provided for the level-processing unit 304 from the input buffer 302.

Figure 3:
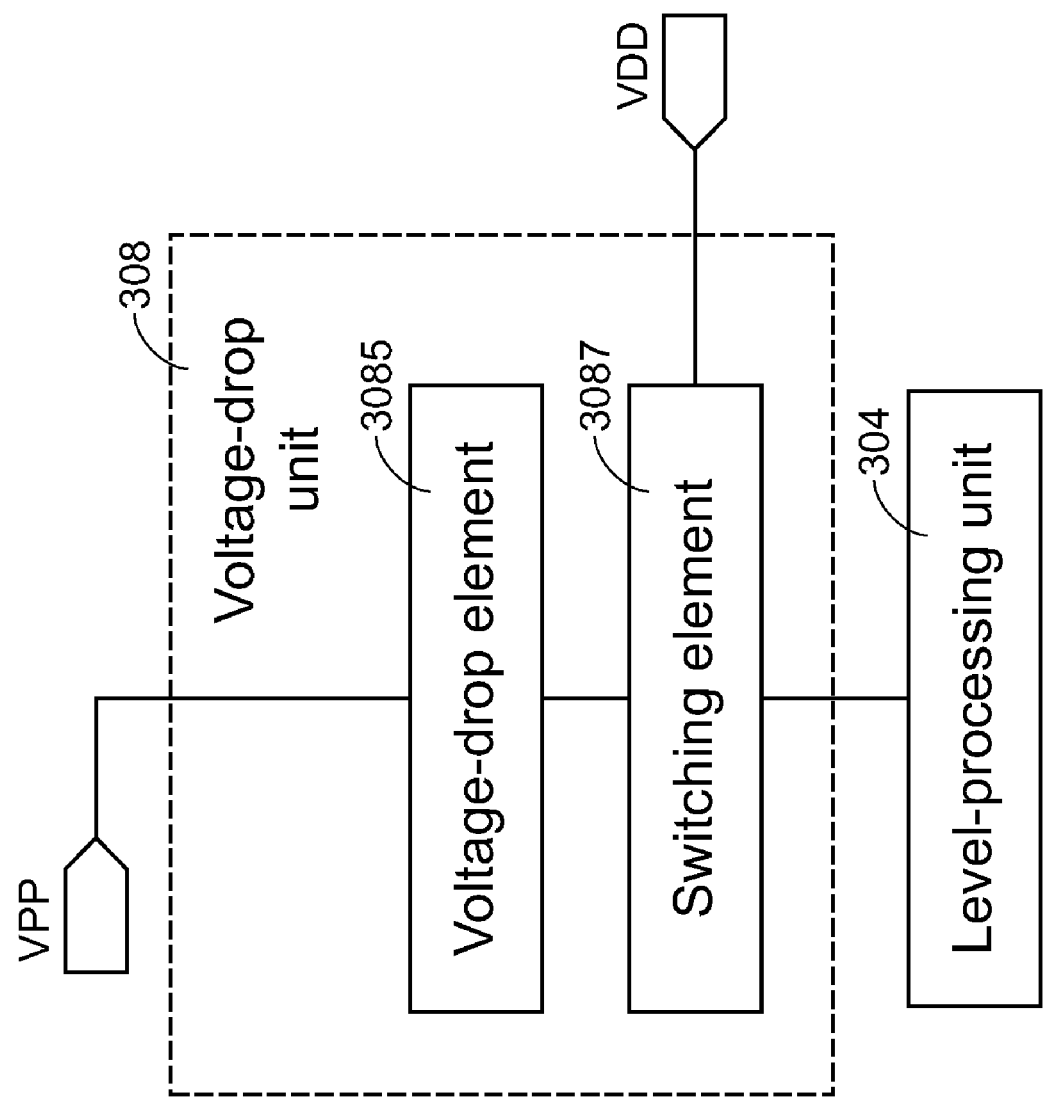
FIG. 3 is a functional block diagram illustrating an embodiment of a voltage-drop unit for use in the level shifter of FIG. 2.

An embodiment of the voltage-drop unit 308 will be described hereinafter with reference to FIG. 3. In this embodiment, the voltage-drop unit 308 includes a voltage-drop element 3085 and a switching element 3087 coupled between the voltage-drop element 3085 and the level-processing unit 304 in series, wherein the voltage-drop element 3085 is biased by the second voltage source VPP and the switching element 3087 is biased by the first voltage source VDD.

When the first voltage source VDD stays off while the second voltage source VPP is switched on, then the switching element 3087 is switched on. Meanwhile, the second voltage source VPP drops to a voltage approximate to the level of the first voltage source VDD, which is referred to as the initializing voltage. Therefore, the initializing voltage can be supplied to the level-processing unit 304 through the switched-on switching element 3087. Afterwards, once the first voltage source VDD is switched on and has stabilized, the switching element 3087 will become OFF so that the level shifter 20 will restore to its normal operational state where the input buffer 302 works normally with the first voltage source VDD.

Figure 4:
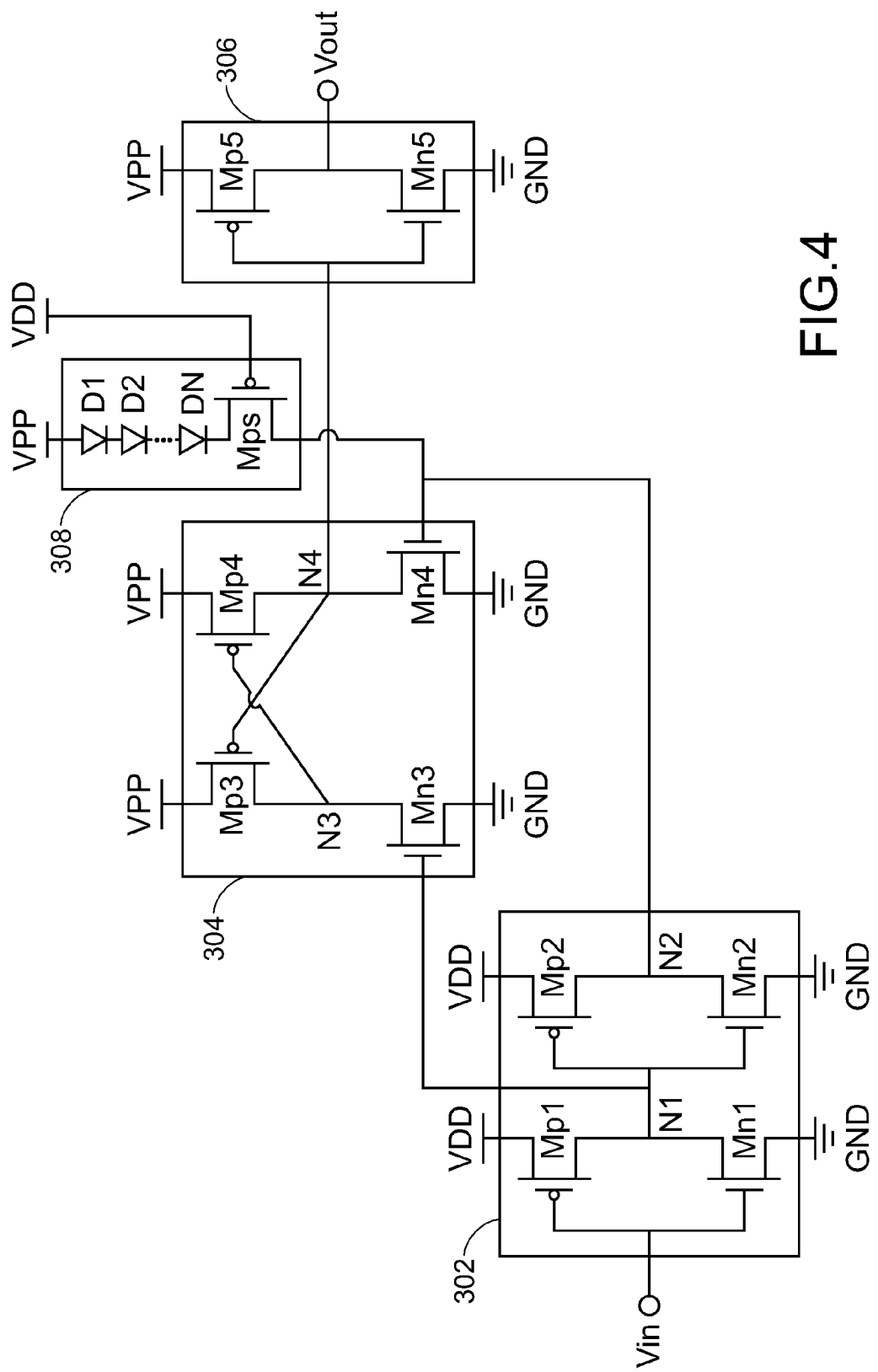
FIG. 4 is an exemplified circuit diagram of the level shifter of FIG. 2.

FIG. 4 exemplifies circuitry for implementing the level shifter of FIG. 2. As shown, the input buffer 302 includes a first PMOS transistor Mp1, a second PMOS transistor Mp2, a first NMOS transistor Mn1, and a second NMOS transistor Mn2. The first voltage source VDD is applied to the sources of the first PMOS transistor Mp1 and the second PMOS transistor Mp2. The sources of the first NMOS transistor Mn1 and the second NMOS transistor Mn2 are grounded. The gates of the first PMOS transistor Mp1 and the first NMOS transistor Mn1 are coupled to the input signal Vin. The drain of the first PMOS transistor Mp1 is coupled to the drain of the first NMOS transistor Mn1 via a first node N1. The gates of the second PMOS transistor Mp2 and the second NMOS transistor Mn2 are coupled to the first node N1. The drain of the second PMOS transistor Mp2 is coupled to the drain of the second NMOS transistor Mn2 via a second node N2, which is also an output end of the input buffer 302. The input buffer 302 is coupled to the level-processing unit 304 via the first node N1 and the second node N2.

Furthermore, the level-processing unit 304 includes a third PMOS transistor Mp3, a fourth PMOS transistor Mp4, a third NMOS transistor Mn3, and a fourth NMOS transistor Mn4. The second voltage source VPP is applied to the sources of the third PMOS transistor Mp3 and the fourth PMOS transistor Mp4. The third NMOS transistor Mn3 has a gate coupled to the first node N1, a drain coupled to the drain of the third PMOS transistor Mp3 via a third node N3, and a source grounded. The fourth NMOS transistor Mn4 has a gate coupled to the second node N2, a drain coupled to the drain of the fourth PMOS transistor Mp4 via a forth node, and a gate coupled to the voltage-drop unit 308. Furthermore, the gate of the fourth PMOS transistor Mp4 is coupled to the third node N3; and the gate of the third PMOS transistor Mp3 is coupled to the output buffer 306 via the third node N4.

The output buffer 306 includes a fifth PMOS transistor Mp5 and a fifth NMOS transistor Mn5. The gates of the fifth PMOS transistor Mp5 and the fifth NMOS transistor Mn5 are coupled to the fourth node N4. The second voltage source VPP is applied to the source of the fifth PMOS transistor Mp5. The source of the fifth NMOS transistor Mn5 is grounded. The drain of the fifth PMOS transistor Mp5 is coupled to the drain of the fifth NMOS transistor Mn5 and an output signal Vout is provided at the junction node.

The voltage-drop element 3085 includes a plurality of diodes D1~DN connected in series and coupled to the switching element 3087. The switching element 3087 can be a switching transistor, e.g. a PMOS transistor Mps. The switching transistor Mps has a gate coupled to the first voltage source VDD, a source coupled to the series connected diodes D1~DN, and a drain coupled to the gate of the fourth NMOS transistor Mn4.

While the first voltage source VDD and the second voltage source VPP are switched on at the same time, assuming the input signal Vin is at a high level, e.g. at the VDD level, Mn1 is conducted, Mp1 is not conducted, and the first node N1 is at a low level, e.g. at the GND level. Meanwhile, Mp2 is conducted, Mn2 is not conducted, and the second node N2 is at a high level, e.g. at the VDD level. Since the first node N1 is at the low level and the second node N2 is at the high level, Mn3 is not conducted and Mn4 is conducted; and as a result, the fourth node N4 is at a low level, e.g. at the GND level. Thus Mp3 is conducted and the third node N3 is at a high level, e.g. at the VPP level; and Mp4 is not conducted. As the fourth node N4 is at the low level, Mn5 is not conducted and Mp5 is conducted. Therefore, the output signal Vout is at a high level, e.g. at the VPP level.

Assume the Vin is at a low level, e.g. at the GND level, instead of the high level, Mn1 is not conducted and Mp1 is conducted; and thus the first node N1 is at a high level, e.g. at the VDD level. Meanwhile, Mp2 is not conducted and Mn2 is conducted; and as a result, the second node N2 is at a low level, e.g. at the GND level. Since the first node N1 is at the high level and the second node N2 is at the low level, Mn3 is conducted and Mn4 is not conducted; and therefore, the third node N3 is at a low level, e.g. at the GND level. Meanwhile, Mp4 is conducted, the fourth node N4 is at a high level, e.g. at the VPP level, and Mp3 is not conducted. While the fourth node N4 is at the high level, Mn5 is conducted and Mp5 is not conducted; and therefore, the output signal Vout is at a low level, e.g. at the GND level.

Accordingly, in a normal operational state that both the voltage sources VDD and VPP are switched on, the switching element Mps is not conducted. As a result, the voltage-drop unit 308 does not work.

On the other hand, if the second voltage source VPP is switched on while the first voltage source VDD stays off, the input buffer 302 cannot work normally. Under this circumstance, the voltage-drop unit 308 generates an initializing voltage with the biasing voltage VPP and provides the initializing voltage for the level-processing unit 304 to facilitate its work. In other words, the OFF state of the first voltage source VDD results in the ON state of the transistor Mps in the voltage-drop unit 308. The second voltage source VPP, through the diodes D1~DN connected in series, generates a signal with a voltage level close to VDD, which serves as the initializing voltage and inputted into the gate of the transistor Mn4. Therefore, the transistor Mn4 is conducted, the fourth node N4 is at a low level, e.g. at the GND level, the transistor Mp5 is conducted, the transistor Mn5 is not conducted, and the output signal Vout is at a high level, e.g. at the VPP level.

In view of the foregoing, due to the disposition of the voltage-drop unit, the level shifter of the present invention can still work normally even if the different voltage sources are not synchronously switched on. Furthermore, the voltage-drop unit is disabled when after all voltage sources are in an ON state so that the level shifter can work according to the general principle.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter for generating an output signal from an input signal comprising:
    an input buffer biased with both a first voltage and a ground voltage and receiving the input signal, wherein the input buffer has a first output end and a second output end;
    an output buffer biased with both a second voltage and the ground voltage and outputting the output signal;
    a level-processing unit coupled between the output buffer and the input buffer via the first output end and the second output end, wherein the level-processing unit is biased with both the second voltage and the ground voltage for shifting the input signal to provide the output signal; and
    a voltage-drop unit coupled to the level-processing unit, biased with both the first voltage and the second voltage, and providing an initializing voltage for the level-processing unit according to the second voltage while the first voltage source is in an OFF and the second voltage is switched on;
    wherein the voltage-drop unit comprises:
        a voltage-drop element coupled to the second voltage for providing a voltage drop of the second voltage; and
        a switching element coupled to the voltage-drop element in series, wherein the switching element is conducted in response to the OFF state of the first voltage and provides the initializing voltage for the level-processing unit.

2. The level shifter according to claim 1 wherein the voltage-drop element includes a plurality of diodes connected in series, having an input end which receives the second voltage and an output end which is coupled to the switching element.

3. The level shifter according to claim 1 wherein the switching element includes a switching transistor having a gate receiving the first voltage, a source coupled to the voltage-drop element, and a drain coupled to the level-processing unit.

4. The level shifter according to claim 1 wherein the initializing voltage is approximate to the first voltage.

5. The level shifter according to claim 1 wherein the input signal is ranged between the first voltage and the ground voltage, and the output signal is ranged between the second voltage and the ground voltage.

6. The level shifter according to claim 1 wherein the first voltage is lower than the second voltage.

7. The level shifter according to claim 1 wherein the input buffer comprises: a first P-type transistor, a second P-type transistor, a first N-type transistor, and a second N-type transistor, wherein the first voltage is applied to the sources of the first P-type transistor and the second P-type transistor; the sources of the first N-type transistor and the second N-type transistor are grounded; the gates of the first P-type transistor and the first N-type transistor receive the input signal; the drain of the first P-type transistor is coupled to the drain of the first N-type transistor via a first node; the gates of the second P-type transistor and the second N-type transistor couple to the first node; and the drain of the second P-type transistor is coupled to the drain of the second N-type transistor via a second node.

8. The level shifter according to claim 1 wherein the level-processing unit comprises: a third P-type transistor, a fourth P-type transistor, a third N-type transistor, and a fourth N-type transistor, wherein the second voltage source is applied to the sources of the third P-type transistor and the fourth P-type transistor; the sources of the third N-type transistor and the fourth N-type transistor are grounded; the gate of the third N-type transistor is coupled to the first input end of the input buffer; the gate of the fourth N-type transistor is coupled to the second input end of the input buffer and the voltage-drop unit; the drain of the third N-type transistor is coupled to the drain of the third P-type transistor and the gate of the fourth P-type transistor; and the drain of the fourth N-type transistor is coupled to the drain of the fourth P-type transistor and the gate of the third P-type transistor.

9. The level shifter according to claim 1 wherein the output buffer comprises: a fifth P-type transistor and a fifth N-type transistor, wherein the source of the fifth P-type transistor receives the second voltage; the source of the fifth N-type transistor is grounded; the gates of the fifth P-type transistor and the fifth N-type transistor are coupled to the level-processing unit; the drains of the fifth P-type transistor and the fifth N-type transistor are coupled to each other and further coupled to the level shifter for outputting the output signal.

* * * * *